WIDE-BAND LOW DISTORTION TWO TRANSISTORS AMPLIFIER

Filed Feb. 28, 1966 Sheet 1 of 2

INVENTORS
JOHANNES A. GREEFKES
KAREL RIEMENS
LEENDERT G. KRUL
WILHELMUS A. J. M. ZWIJSEN
BY Frank R. Jaifani
AGENT INVENTORS
JOHANNES A. GREEFKES
KAREL RIEMENS
LEENDERT G. KRUL
WILHELMUS A. J. M. ZWIJSEN
BY
AGENT 3,450,998

WIDE-BAND LOW DISTORTION TWO-TRANSISTOR AMPLIFIER

Johannes Anton Greefkes, Karel Riemens, Leendert Gerardus Krul, and Wilhelmus Antonius Joseph Marie Zwijsen, Emmasingel, Eindhoven, Netherlands, assignors, by mesne assignments, to U.S. Philips Corporation, New York, N.Y., a corporation of Delaware Filed Feb. 28, 1966, Ser. No. 530,529
Claims priority, application Netherlands, Mar. 30, 1965, 6503996; Aug. 26, 1965, 6511134
Int. Cl. H03f *3/18*
U.S. Cl. 330—17 3 Claims

ABSTRACT OF THE DISCLOSURE

A low distortion wide-band amplifier including a first transistor of one conductivity whose output is coupled through an emitter-follower of opposite conductivity. The first transistor has a first resistor in its emitter circuit, and has in its collector circuit the series combination of a plurality of forward poled diodes and a second resistor. The ratio between the second and first resistors is selected to be one less than the number of diodes. The diodes may be replaced with a third transistor.

The invention relates to an amplifying device comprising at least two transistors of opposite conductivity types, the collector of the first transistor being connected with the base of the second transistor while the emitter circuit of the second transistor includes an impedance, preferably a resistor, which is high with respect to the emitter input impedance of the second transistor. Such amplifiers can be used for amplifying signals having a wide frequency band, for example, telephone signals and video signals. The frequency range may then extend from very low frequencies—if desired even from the frequency 0, i.e. direct voltage—to comparatively high frequencies of, for example, up to a few tens of mc./s.

It is then essential that the amplifier should exhibit a minimum of distortion. As is known, distortion can be suppressed by means of negative feedback. In the most cases, however, this negative feedback involves a decrease in amplification so that a greater number of amplifier elements must be used to attain the required amplification. Moreover, the risk of undesirable instability phenomena such as spontaneous generating is greater, as a result of which more precautions are required in order to obtain an amplifying device which is reliable in operation.

Particularly in transistor amplifiers, the distortion provides a great problem owing to the non-linearities exhibited by the various characteristic values of the transistors. For example, the emitter-base input of the transistor has a more or less expontential current-voltage characteristic curve the influence of which can be reduced by adjusting the transistor to a comparatively high rest current and/or by using a high degree of negative feedback. Both measures have disadvantages and the invention has for its object to meet these disadvantages. The invention is characterized in that the emitter circuit of the first transistor includes a second impedance, preferably again a resistor, and in that the collector circuit of this transistor includes the series-combination of several semiconductor diodes polarized in the forward direction and of a third impedance, preferably again a resistor, which is higher than the said second impedance.

The invention will now be described more fully with reference to the drawing.

Figure 1:
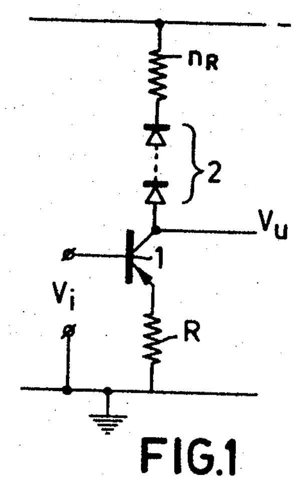
FIG. 1 shows an amplifier part for the explanation of the principle of the invention.

FIG. 1 shows a junction transistor 1 in emitter arrangement. The input signal $V_i$ is supplied to its base. The emitter circuit of transistor 1 includes a resistor R while its collector circuit includes the series-combination of a plurality of semi-conductor diodes 2 polarized in the forward direction by the collector direct current of the transistor 1 and of a resistor $n$R. The resistor R may be, but need not necessarily be high with respect to the emitter input impedance of transistor 1. The resistor $n$R is chosen $n$ times higher than the resistor R, while $n$ represents the number of diodes 2. The voltage produced across the resistor R is equal to the voltage $V_i$ minus the emitter-base control voltage of the transistor 1. When the base current of transistor 1 is neglected, the current through the resistor R is equal to the current through the series-combination 2,$n$R. An output voltage V$u$ is therefore produced across the said series-combination which is $n$ times the voltage $V_i$, since the direct current flowing through the diodes 2 is the same as that flowing through the transistor so that the voltage drop for each diode—irrespective of variations in supply and temperature—is substantially equal to that across the emitter-base path of the transistor 1. The transistor 1 and the diodes 2 are preferably arranged in the form of an integrated circuit arrangement, that is to say on one crystal supporting body (substratum).

Although the base-emitter input of the transistor 1 has a more or less exponential current-voltage characteristic curve, the distortion measured in the voltage V$u$ is nevertheless very low, since the curvature of this characteristic curve is substantially equal to that of the diodes 2 so that also for each instantaneous value of the input voltage the voltage drop across the emitter-base path of the transistor 1 is equal to that across each of the diodes 2. If this effect should be utilized, however, the output voltage V$u$ must be loaded only by a very high resistor or impedance, which involves disadvantages in practice.

Figure 2:
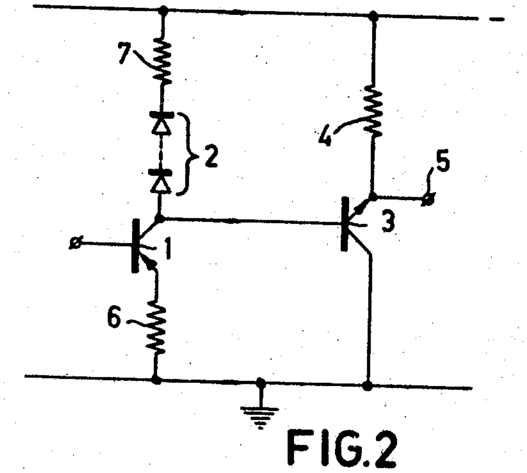
FIG. 2 illustrates a principal circuit diagram according to the invention.

In the principal circuit diagram of the invention as shown in FIG. 2, this problem is solved in that the collector of the transistor 1 is connected to the base of a second junction transistor 3 of opposite conductivity type (which may form part of the same integrated circuit arrangement) the emitter circuit of which includes a resistor or in general an impedance 4 which is high with respect to the emitter input impedance of the transistor 3. The transistor 3 then acts as an emitter follower and the output voltage may be derived. for example, from an output terminal 5. If desired, as an alternative, a resistor or an impedance may be connected in the collector circuit of the transistor 3 and the output voltage may be derived from this resistor. The circuit arrangement is further completed by the resistor 6 in the emitter circuit of the transistor 1 which corresponds with the resistor R of FIG. 1 and by the resistor 7 in the collector circuit of this transistor which corresponds with the resistor $n$R of FIG. 1. In contrast with FIG. 1, however, the number of diodes 2 in FIG. 2 is chosen to be one higher than that in FIG. 1, i.e. $n+1$ diodes 2. This is based on the following considerations.

If the transistor 3 is adjusted to the same direct current as the transistor 1, the voltage drop across the base-emitter path of the transistor 3 will be equal again to the voltage drop across each of the diodes 2. Not only is the voltage drop then equal, but also the curvature of the characteristic curve of the base-emitter input of the transistor 3 and that of such a diode are then substantially equal so that—irrespective of the variations in control voltage and temperature—the voltage at the emitter of the transistor 3 is just equal to the voltage produced across the series-combination of the resistor 7 and $n$ of the diodes 2. Consequently, the transistor 3 does not bring about distortion in contrast with the case in which the transistor 3 was chosen to be of the same conductivity type as the transistor 1.

Figure 3:
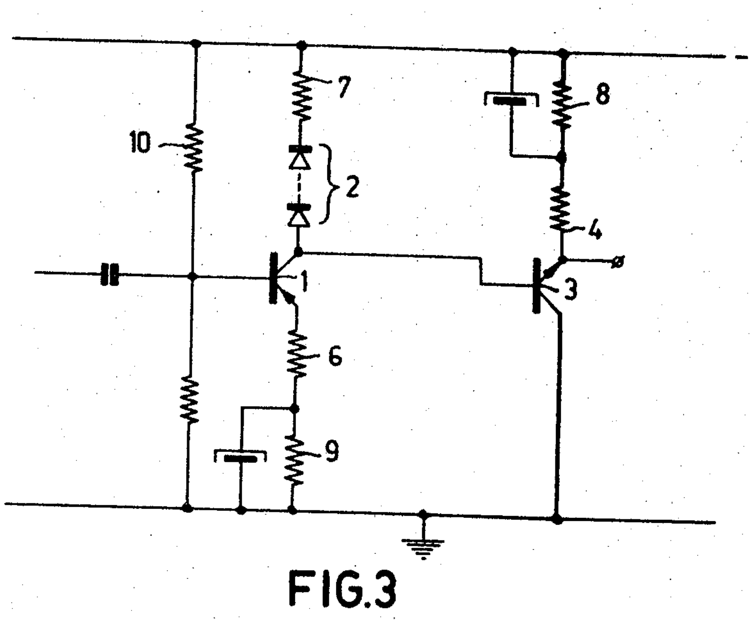
FIG. 3 shows a further developed embodiment.

The circuit arrangement chosen renders it possible to use comparatively low-ohmic resistors 4, 6 and 7 without the risk of an impermissibly high degree of distortion in case of a low direct-current adjustment of the transistors 1 and 3. Consequently, signals of very great band-width can be amplified. It stands to reason that the remaining distortion can be further reduced by negative feedback, for example, by the interposition of a resistor between the emitter of transistor 3 and the base of transistor 1, but it has been found that this is hardly necessary in practice: with 20% excitation of the transistors (ratio between the alternating-current amplitude and the direct current of the transistor), a distortion value of less than 60 db can readily be obtained in a band-width of from 0 c./s. to a few mc./s. FIG. 3 shows the circuit arrangement used in this case in which again the same circuit elements are utilized as in FIG. 2 on the understanding that a resistor 8 decoupled for the signal oscillations is connected in series with the resistor 4 while a resistor 9 decoupled for the signal oscillations is connected in series with the resistor 6. The resistors 4, 6, 7, 8 and 9 amounted to 150Ω, 22Ω, 130Ω, 120Ω and 100Ω, respectively. The number of diodes 2 was chosen to be 7 and the voltage amplification factor was just 6.

It stands to reason that in principle the resistors 4, 6 and 7 can be replaced by impedances. The only condition applying to 4 is that its impedance should be high with respect to the emitter input impedance of the transistor 3 while the ratio between the impedances 7 and 6 must be one less than the number of diodes 2 in case of the same direct current adjustment of the transistors 1 and 3. If on the contrary, for example, the transistor 3 is adjusted to a higher current than the transistor 1, the additional diode 2 will not completely compensate for the distortion so that the ratio between the resistors or impedances 7 and 6 must be chosen lower. If desired, it is also possible to arrange impedances or, for example, a blocking capacitor in the circuit between the collector of the transistor 1 and the base of transistor 3. The direct current connection shown renders it possible to obtain a simple working-point stabilization of the transistors known per se by connecting the junction of the resistors 4 and 8 through a resistor to the base of the transistor 1. This resistor (not shown) may replace the resistor 10 between the base of the transistor 1 and the source of supply.

Figure 4:
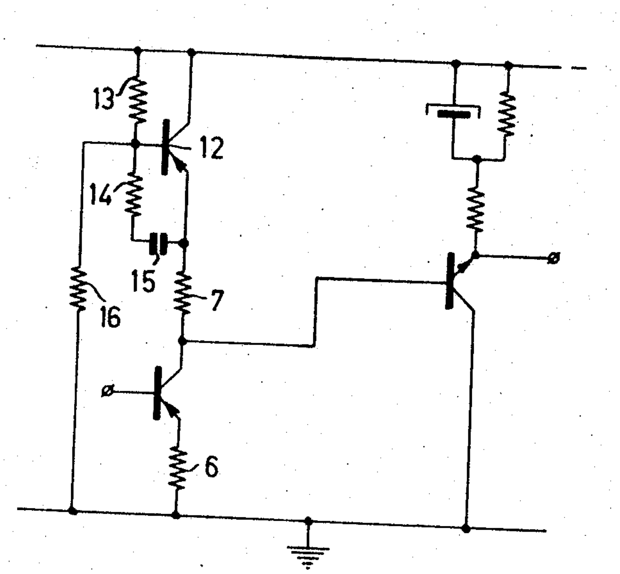
FIG. 4 shows an alternative embodiment of FIG. 3.

FIG. 4 shows an alternative embodiment of the circuit arrangement of FIG. 3 in which the series-combination of the diodes 2 is replaced by an equivalent transistor circuit comprising an auxiliary transistor 12 the base of which is connected to a voltage divider 13, 14 included between its emitter and its collector, the division factor of which voltage divider is just equal to the number of diodes required. The capacitor 15 is a blocking capacitor and the resistor 16 serves to adjust the correct bias base current of the transistor 12. The resistors 13 and 14 are preferably of a value such that the current flowing through these resistors is small with respect to the current flowing through the transistor 12 but that the resistor 14 is at the same time small with respect to the base input resistance of the transistor 12.

Such a circuit arrangement behaves just like the said series-combination of diodes 2. For if the current is measured as a function of the voltage between the emitter and the collector of the transistor 12 and if the ratio between the resistors 13 and 14 is chosen to be$=n$, in case the emitter-collector voltage exceeds $n+1$ times the internal emitter-base threshold voltage, the voltage actuating the potentiometer between the emitter and the base just exceeds this threshold voltage so that the transistor starts conveying current. If the emitter-collector voltage increases to higher values, this results in a corresponding increase in current which follows entirely the current-voltage characteristic curve of the emitter-base diode. For if the emitter-collector voltage increases by an amount $\Delta V_{ec}$, the voltage at the potentiometer part connected between the base and the emitter of the transistor 12 increases by an amount $$\frac{\Delta V_{ec}}{n+1}$$

consequently, the base current increases in accordance with the emitter-base diode characteristic curve so that, if it is assumed that the collector-base current amplification factor of the transistor has a very high value (consequently that the collector-emitter current amplification factor of the transistor lies just below 1), the collector current finally increases likewise in accordance with this diode characteristic curve. The collector current then has the same exponential dependence upon the collector-emitter voltage as is measured at the emitter-base input of the transistor, on the understanding that, in order to attain the same collector current as that holding for the emitter-base diode, the value of the emitter-collector voltage must be chosen $n+1$ times greater. Consequently, this actually corresponds with the case in which $n+1$ of such diodes would be connected in series.

Upon further consideration it appears that the resistors 13 and 14 correspond effectively to a low resistance in series with the auxiliary circuit 12, 13, 14 and must therefore be taken into account for the value of resistor 7. This implies a small correction such that the ratio between the resistors 13 and 14 must be slightly higher than $n$ if the ratio between the resistors 7 and 6 is equal to $n$. This ratio need no longer be an integer, as is the case in the circuits of FIGS. 1 to 3, but it may be chosen at will. The compensation for the non-linear base input characteristic curve of the transistor 3 can now fulfil very high requirements also if the bias current adjustment of this transistor is higher than that of the transistor 1 owing to a choice of the resistors 6, 7, 13 and 14 adapted thereto.

What is claimed is:

1. An amplifying device comprising two transistors of opposite conductivity tyes, each including an emitter, base and collector, circuit means applying bias to the emitter-collector paths of each of said transistors, the collector of the first transistor being connected to the base of the second transistor, a first impedance series connected in the emitter circuit of the second transistor, said first impedance having a magnitude which is high with respect to the emitter input impedance of the second transistor, the emitter circuit of the first transistor including a series connected second impedance, the collector circuit of said first transistor including the series-combination of $n$ diodes polarized in the forward direction with respect to the polarity of said first transistor, and a third impedance, connected in series with said diodes, and having a magnitude which is higher than the magnitude of said second impedance, the ratio between the third impedance and the second impedance being one lower than the number of diodes.

2. A device as claimed in claim 1, wherein both transistors are biased to approximately the same direct current.

3. An amplifying device comprising two transistors of opposite conductivity types, each including an emitter, base and collector, circuit means applying bias to the emitter-collector paths of each of said transistors, the collector of the first transistor being connected to the base of the second transistor, a first impedance series connected in the emitter circuit of the second transistor, said first impedance having a magnitude which is high with respect to the emitter input impedance of the second transistor, the emitter circuit of the first transistor including a series connected second impedance, the collector circuit of said first transistor including the emitter collector path of a third transistor, a voltage divider connected between the emitter and collector of said third transistor, means connecting the base electrode of said third transistor to a tap on said voltage divider, and a third impedance connected in series with said third transistor emitter collector path and having a magnitude which is higher than the magnitude of said second impedance.

References Cited

Jones: General Electric Application Note 90.3, April 1962, p. 5.

ROY LAKE, *Primary Examiner.*

SIEGFRIED H. GRIMM, *Assistant Examiner.*

U.S. Cl. X.R.

330—18, 20, 24